United States Patent
Kawasaki et al.

(10) Patent No.: US 6,383,060 B2
(45) Date of Patent: May 7, 2002

(54) METHOD OF POLISHING SILICON WAFER

(75) Inventors: Nobuyuki Kawasaki; Masanori Mori, both of Saga-ken (JP)

(73) Assignee: Sumitomo Metal Industries, Ltd. (JP)

( * ) Notice: Subject to any disclaimer, the term of this patent is extended or adjusted under 35 U.S.C. 154(b) by 0 days.

(21) Appl. No.: 09/842,016

(22) Filed: Apr. 26, 2001

(30) Foreign Application Priority Data

Apr. 27, 2000 (JP) ........................................ 2000-128529

(51) Int. Cl.⁷ ................................................. B24B 1/00
(52) U.S. Cl. ............................. 451/41; 451/36; 451/60; 451/287; 438/692; 438/693
(58) Field of Search ............................. 451/36, 41, 60, 451/287; 438/692, 693

(56) References Cited

U.S. PATENT DOCUMENTS 6,303,049 B1 * 10/2001 Lee et al. .................. 252/79.1

FOREIGN PATENT DOCUMENTS

| JP | 4-20742 | 4/1992 |
|----|---------|--------|
| JP | 2000-15560 | 6/1998 |
| JP | 10-279928 | 10/1998 |
| JP | 11-21545 | 1/1999 |
| JP | 11-186202 | 7/1999 |
| WO | 94/28194 | 5/1994 |

* cited by examiner

Primary Examiner—Joseph J. Hail, III
Assistant Examiner—Shantese McDonald
(74) Attorney, Agent, or Firm—Lorusso & Loud

(57) ABSTRACT

Mirror-polishing of a silicon wafer is conducted using an abrasive agent which contains silica as a principal ingredient, and either one of the ingredients set forth at (1) and (2):

(1) an ingredient which is selected from alkali sulfide, alkali hydrogensulfide, and the mixture thereof; and (2) a chelate agent which contains at least α-benzoinoxime, diethyldithiocarbamic acid, cupferron, xanthogenic acid, neocupferron, beryllon II, β-quinolinol, 1,1,1-trifluoro-3(2-thenoyl)acetone, dimethylglyoxime, and 1-(2-pyridylazo)-2-naphthol.

4 Claims, 1 Drawing Sheet

METHOD OF POLISHING SILICON WAFER

BACKGROUND OF THE INVENTION

1. Field of the Invention

The present invention relates generally to a method of polishing silicon wafer. More specifically, it relates to a method of polishing a silicon wafer, by which contamination by a metal, such as copper, nickel, or the like, is prevented while the silicon wafer is being subjected to a mirror-polishing process.

2. Description of Related Art

Usually, a silicon wafer is manufactured by slicing a single-crystal ingot into a wafer, and thereafter applying to the wafer the predetermined steps of chamfering, lapping, etching, mirror-polishing, and cleaning.

At the mirror-polishing step (hereinafter, the mirror-polishing step is occasionally referred to simply as "polishing step"), in general, a silica-containing abrasive agent, which is alkaline aqueous solution containing fine (i.e., very small) silica (i.e., $SiO_2$) abrasive grains dispersed therein, (referred to as "alkaline silica-containing abrasive agent") is used. In case of the alkaline silica-containing abrasive agent, the silicon wafer is polished by means of a chemical etching action of the alkaline aqueous solution and by means of a mechanical action of the silica.

However, commercially available alkaline silica-containing abrasive agents usually contain an impurity of metal (hereinafeter, referred to as "metallic impurity"). Typical examples of the metallic impurity include copper, nickel, chromium and iron.

Accordingly, when the silicon wafer is polished by such a commercially available alkaline silica-containing abrasive agent in which the metallic impurities are present, among the metallic impurities, metal ions, such as copper ion, nickel ion, chromium ion, iron ion, diffuse in a deep interior of the wafer in the course of polishing step, and cannot be easily removed even at the next cleaning step, thereby deteriorating a performance of the semiconductor device manufactured from the wafer, as is known in the art.

As a measure to prevent the metallic contamination, it is conceivable to use a high-purity silica-containing abrasive agent which does not contain such metallic impurities. However, a commercially available high-purity silica-containing abrasive agent is so expensive as to increase the manufacturing cost, so that it cannot be employed for the actual production. Further, even when the high-purity silica-containing abrasive agent is used, contamination caused by the apparatus cannot be avoided, so that the high-purity silica-containing agent, in some cases, fails to exhibit its sufficient effect.

Another abrasive agent obtained by adding several percent by weight of amine to the alkaline silica-containing abrasive agent (referred to as "amine-added silica-containing abrasive agent") is often used to increase the polishing speed at the time of polishing the silicon wafer. In case of the amine-added silica-containing abrasive agent, it is known that, although the polishing speed is increased, the metallic contamination to the silicon wafer is rather accelerated, so that it is difficult to obtain a high-purity silicon wafer.

To solve this problem of the amine-added silica-containing abrasive agent, Japanese application laid-open No. 11-186202 shows a recognition that amine is regarded as a cause to accelerate the metallic contamination and discloses a silica-containing abrasive agent which does not contain amine, more particularly, an abrasive agent obtained by adding an oxoacid compound to the silica-containing abrasive agent (referred to as "oxoacid compound-added silica-containing abrasive agent").

However, according to the inventors' study, employing the oxoacid compound-added silica-containing abrasive agent in polishing the silicon wafer neither increases the polishing speed nor produces a sufficient effect in reducing the metallic contamination.

In view of the above-mentioned problems in the conventional art, the inventors have studied various types of abrasive agents to find an optimum abrasive agent for a silicon wafer which can prevent or suppress the metallic contamination at the polishing step while maintaining the polishing speed. As a result, they have found that prevention or suppression of the metallic contamination can be realized by adding alkali sulfide or alkali hydrogensulfide to a silica-containing abrasive agent. Also, they have found that prevention or suppression of the metallic contamination can be realized by adding a chelate agent to a silica-containing abrasive agent.

SUMMARY OF THE INVENTION

It is therefore an object of the present invention to provide a method of polishing the silicon wafer using an abrasive agent which can efficiently prevent or suppress metallic contamination to the silicon wafer at the mirror-polishing step so as to prevent deterioration of the quality of the silicon wafer.

To achieve the above object, a first aspect of the present invention provides a method of polishing a silicon wafer using an abrasive agent comprising: silica as a principal ingredient; and an ingredient which is selected from alkali sulfide, alkali hydrogensulfide, and the mixture thereof.

The alkali sulfide and the alkali hydrogensulfide are preferably ammonium sulfide and ammonium hydrogensulfide, respectively.

A second aspect of the present invention provides a method of polishing a silicon wafer using an abrasive agent comprising: silica as a principal ingredient; and a chelate agent which contains at least α-benzoinoxime, diethyldithiocarbamic acid, cupferron, xanthogenic acid, neocupferron, beryllon II, β-quinolinol, 1,1,1-trifluoro-3(2-thenoyl)acetone, dimethylglyoxime, and 1-(2-pyridylazo)-2-naphthol.

The chelate agent may be contained in the form of a derivative thereof or a salt thereof.

Owing to the constitution of the first aspect of the present invention in which the abrasive agent containing alkali sulfide or alkali hydrogensulfide is used in the method of polishing a silicon wafer, the copper ion and the sulfer ion present in the abrasive agent result in the formation and precipitation of copper sulfide slightly soluble in water so as to decrease the concentration of the copper ion in the abrasive agent, whereby the contamination by copper (referred to "copper contamination") to the silicon wafer is reduced.

Owing to the constitution of the second aspect of the present invention in which the abrasive agent containing the chelate agent is used in the method of polishing a silicon wafer, the copper ion present in the abrasive agent is trapped by the chelate agent so as to suppress the adsorption of the copper ion onto the silicon wafer, whereby the copper contamination to the silicon wafer is reduced.

Other features, objects and advantages of the present invention will become apparent from the following description of the preferred embodiment with reference to the drawings.

DETAILED DESCRIPTIONS OF THE PRESENT INVENTION AND PREFERRED EMBODIMENTS

Preferred embodiments of the present invention will be described with reference to the attached drawings.

First Embodiment

Hereinafter, a first embodiment of the present invention will be described.

Figure 2:
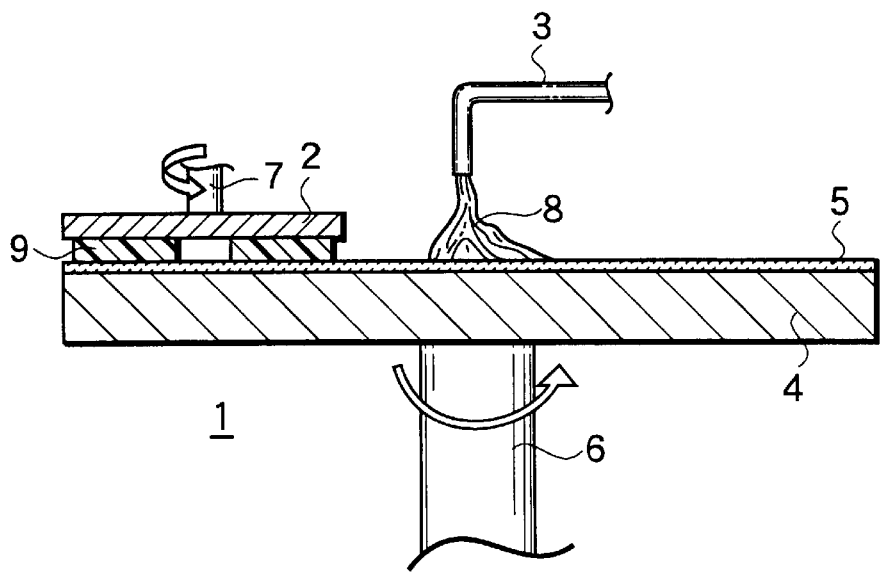
FIG. 2 is a view showing a polishing apparatus in which an abrasive agent and method for polishing a silicon wafer according to the embodiments of the present invention is used.

First, referring to FIG. 2, description will be made as to a polishing apparatus which is used in a method of polishing a silicon wafer according to the first embodiment.

The polishing apparatus has a rotational disk 1, a wafer holder 2 and an abrasive agent supplying unit 3.

The rotational disk 1 has a rotational disk supporting body 4, the upper surface thereof being attached with an abrasive pad 5. The rotational supporting disk 1 is rotated by a rotational axis 6 at a predetermined rotational speed.

The wafer holder 2 holds the wafer 9 on the lower surface thereof by means of vacuum adsorption or the like method, and presses the wafer 9 onto the abrasive pad 5 at a predetermined load while the holder 2 is being rotated by the rotation shaft 7.

The abrasive agent supplying apparatus 3 supplies an abrasive agent 8 onto the abrasive pad 5 at a predetermined flow rate. The wafer 9 is polished by the abrasive agent supplied between the wafer 9 and the abrasive pad 5.

Next, an abrasive agent employed in the method according to the first embodiment will be described. Hereinafter, the abrasive agent employed in the method according to the first embodiment will be referred to as "abrasive agent of the first embodiment".

The abrasive agent of the first embodiment contains silica, which serves as principal ingredient, and ammonium sulfide, which is an example of alkali sulfide.

The abrasive agent of the first embodiment is prepared by adding ammonium sulfide to a commercially available colloidal silica which contains amine (referred to as "commercially available abrasive agent (A)" or simply "agent (A)"). The agent (A) contains amine at a proportion falling within a range of from 5 to 7% by weight with respect to the total amount of the agent (A). The added amount of ammonium sulfide is 0.001% by weight to the total amount of the abrasive agent of the first embodiment.

With respect to the abrasive agent of the first embodiment, certain amounts of copper are intentionally added to prepare three types of copper-added agents for the purpose of examining an ability of the abrasive agent of the first embodiment to suppress copper contamination. Added amounts are 0, 50 and 100 ppb (part per billion).

Using the above-mentioned polishing apparatus, with respect to the three types of copper-added agents, a silicon wafer as a sample is polished under the following conditions.

Specifically, as the sample of silicon wafer, a P-type silicon wafer having a diameter of 200 mm and a crystal axis of <111>, which is produced by means of Czochralski method, is employed.

The sample of silicon wafer is polished with a nonwoven fabric under a polishing pressure of 400 g/cm$^2$ for 20 minutes.

The sample of silicon wafer thus polished is subjected to heat treatment at 650° C., and thereafter the thermal oxidation layer of the polished surface is subjected to vapor-phase decomposition with hydrofluoric acid. The resultant is recovered with a liquid containing hydrochloic acid, and the concentration of copper in the liquid is analyzed by means of atomic absorption spectrometry.

On the other hand, as a comparative example, the commercially available abrasive agent (A) is subjected to the same treatments as in the abrasive agent of the first embodiment. Specifically, using the above-mentioned polishing apparatus, with respect to the three types of copper-added agents of the commercially available abrasive agent (A), a sample of silicon wafer is polished under the same condition as in the abrasive agent of the first embodiment. The comparative example is made to compare an ability to suppress the copper contamination between the abrasive agent of the first embodiment and the commercially available abrasive agent (A).

As another comparative example, another commercially available colloidal silica which contains amine (referred to as "commercially available abrasive agent (B)" or simply "agent (B)") at a proportion falling within a range of from 5 to 7% by weight with respect to the total amount of the agent (B). The proportion of each ingredient in the agent (B) is different from that in the agent (A). The agent (B) is subjected to the same treatments as in the agent (A).

Figure 1:
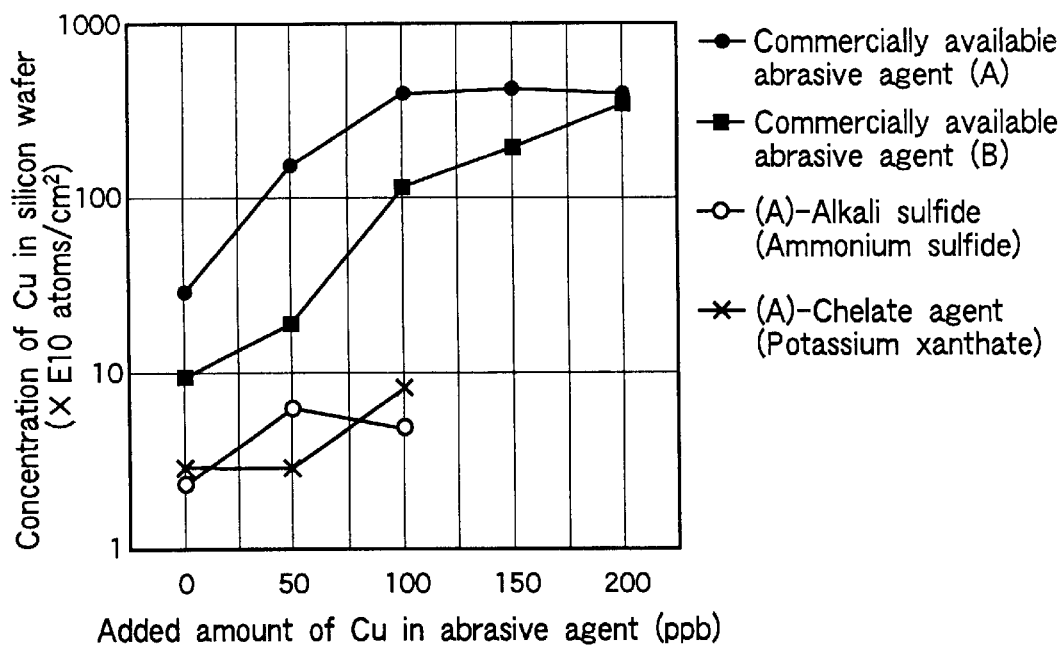
FIG. 1 is a graph showing relationships between an added amount of copper in an abrasive agent and a concentration of copper in a silicon wafer.

The result of the analysis by atomic absorption spectrum with respect to the abrasive agent of the first embodiment and the commercially available abrasive agent (A) is shown in the graph of FIG. 1. The horizontal axis of the graph shows an added amount of copper in an abrasive agent, which represents a degree of copper contamination in an abrasive agent. The vertical axis of the graph shows a concentration of copper, which represents a degree of an ability of the abrasive agent to suppress the copper contamination. In FIG. 1, the abrasive agent of the first embodiment is denoted by "(A)-alkali sulfide (ammonium sulfide)".

As is known from FIG. 1, copper contamination to the silicon wafer in the case of the abrasive agent of the first embodiment is greatly reduced compared with those in the cases of the commercially available abrasive agents (A) and (B).

Note that, in the agents (A) and (B), data on copper-added agents are obtained also with respect to 150 and 200 ppb, for which the abrasive agents of the first and second embodiments has no corresponding data.

Variation of First Embodiment

Note that, in the abrasive agent of the first embodiment, the proportion of each ingredient is determined in view of the size of the used environmental equipment, including a pipe arrangement, a pump, utilities, and the like, and a frequency (i.e., number of times) of circulation of the used abrasive agent. Therefore, the proportion of each ingredient in the abrasive agent of the first embodiment may be determined at another value than that described above. Further, the proportion of each ingredient may be determined according to the concentration of the metallic impurity existing in the abrasive agent which is directly measured. In any case, the proportion of each ingredient basically needs to be 0.000001% by weight or more.

In the abrasive agent of the first embodiment, ammonium sulfide, which is a most preferred example of alkali sulfide, is employed. Alternatively, other types of alkali sulfide may be employed in place of ammonium sulfide. Further, alkali hydrogensulfide, or a mixture of alkali sulfide and alkali hydrogensulfide maybe employed in place of the alkali sulfide. A most preferred example of the alkali hydrogensulfide is ammonium hydrogensulfide.

Further, in the above description of the first embodiment, copper is mentioned as an example of the metallic impurity which must be suppressed by the abrasive agent of the first embodiment. However, the abrasive agent of the first embodiment is also effective to the other metallic impurities, such as nickel, chronium, iron, zinc, alminium, calcium, antimony, gold, silver, cobalt, mercury, and so on.

Second Embodiment

Hereinafter, a second embodiment of the present invention will be described.

First, an abrasive agent employed in a method according to a second embodiment will be described. Hereinafter, the abrasive agent employed in the method according to the second embodiment will be referred to as "abrasive agent of the second embodiment".

An abrasive agent of the second embodiment contains silica, which is a principal ingredient, and potassium xanthate serving as a chelate agent. Thus, the difference of the second embodiment from the first embodiment in constituent element is that ammonium sulfide is replaced by potassium xanthate.

Other than the constituent element of abrasive agent, the second embodiment is the same as the first embodiment. Specifically, the abrasive agent of the second embodiment is prepared by adding potassium xanthate to a commercially available abrasive agent (A). The added amount of potassium xanthate is 0.001% by weight to the total amount of the abrasive agent of the first embodiment. Also, using the above-mentioned polishing apparatus, with respect to three types of copper-added agents of the abrasive agent of the second embodiment, a sample of silicon wafer is polished under the same condition as in the abrasive agent of the first embodiment. Further, the same subsequent treatments are applied.

The result of the analysis by atomic absorption spectrum with respect to the abrasive agent of the second embodiment is also shown in the graph of FIG. 1. In FIG. 1, the abrasive agent of the second embodiment is denoted by "(A)-chelate agent (potasium xanthate)". As is known from FIG. 1, copper contamination to the silicon wafer in the case of the abrasive agent of the second embodiment is greatly reduced compared with those in the cases of the commercially available abrasive agents (A) and (B).

Variation of Second Embodiment

In the above description of the second embodiment, potasium xanthate is employed as an example of a chelate agent. However, other types of chelate agents may be employed.

Employable examples of the chelate agent include α-benzoinoxime, diethyldithiocarbamic acid, cupferron, xanthogenic acid, neocupferron, beryllon II, β-quinolinol, 1,1,1-trifluoro-3(2-thenoyl)acetone, dimethylglyoxime, and 1-(2-pyridylazo)-2-naphthol. The chelate agent may contain these examples singularly or as a combination thereof.

The chelate agent may be in the form of a derivative thereof or a salt thereof.

Advantage of the Invention

As described above, according to the present invention, without using an expensive high purity abrasive agent and without decreasing the polishing speed, metallic contamination to the silicon wafer can be suppressed or prevented efficiently, thereby preventing the deterioration of a performance of the device obtained from the silicon wafer.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of polishing a silicon wafer using an abrasive agent comprising:

silica as a principal ingredient; and an ingredient which is selected from alkali sulfide, alkali hydrogensulfide, and a mixture thereof.

2. The method according to claim 1, wherein the alkali sulfide is ammonium sulfide, and the alkali hydrogensulfide is ammonium hydrogensulfide.

3. A method of polishing a silicon wafer using an abrasive agent comprising:

silica as a principal ingredient; and a chelate agent which contains at least α-benzoinoxime, diethyldithiocarbamic acid, cupferron, xanthogenic acid, neocupferron, beryllon II, β-quinolinol, 1,1,1-trifluoro-3(2-thenoyl)acetone, dimethylglyoxime, and 1-(2-pyridylazo)-2-naphthol.

4. The method according to claim 3, wherein the chelate agent is in the form of a derivative thereof or a salt thereof.

* * * * *